(12) United States Patent
Kim et al.

(10) Patent No.: US 8,885,436 B2
(45) Date of Patent: Nov. 11, 2014

(54) SEMICONDUCTOR MEMORY DEVICE AND METHOD OF DRIVING THE SAME

(75) Inventors: Yeon-Uk Kim, Gyeonggi-do (KR); Hee-Joon Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 86 days.

(21) Appl. No.: 13/602,772

(22) Filed: Sep. 4, 2012

(65) Prior Publication Data

US 2013/0114365 A1  May 9, 2013

(30) Foreign Application Priority Data

Nov. 8, 2011  (KR) .......................... 10-2011-0115893

(51) Int. Cl.
| | |
|---|---|
| *G11C 8/00* | (2006.01) |
| *G11C 11/4072* | (2006.01) |
| *G11C 29/12* | (2006.01) |
| *G11C 29/00* | (2006.01) |
| *G11C 8/10* | (2006.01) |
| *G11C 11/4074* | (2006.01) |
| G11C 11/406 | (2006.01) |
| G11C 7/20 | (2006.01) |
| G11C 5/14 | (2006.01) |

(52) U.S. Cl.
CPC .... *G11C 29/12005* (2013.01); *G11C 11/40611* (2013.01); *G11C 11/4072* (2013.01); *G11C 29/006* (2013.01); *G11C 8/10* (2013.01); *G11C 7/20* (2013.01); *G11C 5/14* (2013.01); *G11C 5/147* (2013.01); *G11C 11/4074* (2013.01)
USPC ....................... 365/230.03; 365/226; 365/201

(58) Field of Classification Search
CPC ........... G11C 11/4072; G11C 11/4074; G11C 11/40611; G11C 5/147; G11C 7/20; G11C 5/14

USPC ...................................... 365/201, 230.03, 226
See application file for complete search history.

(56) References Cited

U.S. PATENT DOCUMENTS

| | | | | |
|---|---|---|---|---|
| 5,982,163 | A * | 11/1999 | Shinozaki ..................... 323/354 |
| 6,724,679 | B2 * | 4/2004 | Nagasawa et al. ........ 365/230.03 |
| 7,107,467 | B2 * | 9/2006 | Lee et al. ...................... 713/300 |
| 7,161,387 | B2 * | 1/2007 | Yamasaki et al. ............... 326/81 |
| 7,417,494 | B2 * | 8/2008 | Choi et al. .................... 327/541 |
| 7,436,719 | B2 * | 10/2008 | Yun .............................. 365/201 |
| 7,495,982 | B2 * | 2/2009 | Chi ............................... 365/203 |
| 7,586,350 | B2 * | 9/2009 | Chung et al. .................. 327/198 |
| 7,599,240 | B2 * | 10/2009 | Shin et al. ..................... 365/226 |
| 7,791,404 | B2 * | 9/2010 | Choi ............................. 327/538 |
| 8,149,633 | B2 * | 4/2012 | Kang ....................... 365/189.07 |
| 8,280,672 | B2 * | 10/2012 | Kim ............................. 702/124 |

FOREIGN PATENT DOCUMENTS

| | | |
|---|---|---|
| KR | 100173935 | 4/1999 |
| KR | 1020050073969 | 7/2005 |
| KR | 1020100132138 | 12/2010 |

* cited by examiner

*Primary Examiner* — Viet Q Nguyen
(74) *Attorney, Agent, or Firm* — IP & T Group LLP

(57) ABSTRACT

Disclosed is a semiconductor memory device, including a plurality of internal voltage generation units configured to be enabled in response to each of a plurality of decoding signals and to generate an internal voltage, a controller configured to generate a plurality of control signals in response to a power up signal and a test mode signal, and a decoder configured to generate the plurality of decoding signals corresponding to at least one decoding source signal and to simultaneously activate some or all of the plurality of decoding signals in response to the control signals.

14 Claims, 5 Drawing Sheets

SEMICONDUCTOR MEMORY DEVICE AND METHOD OF DRIVING THE SAME

CROSS-REFERENCES TO RELATED APPLICATIONS

The present application claims priority of Korean Patent Application No. 10-2011-0115893, filed on Nov. 8, 2011, which is incorporated herein by reference in its entirety.

BACKGROUND

1. Field

Exemplary embodiments of the present invention relate to a semiconductor design technology, and more particularly, to a semiconductor memory device and a method of driving the same.

2. Description of the Related Art

Generally, a semiconductor memory device such as a dynamic random access memory (DRAM) includes a plurality of banks. A predetermined number of banks among a plurality of banks are grouped, and a single internal voltage generation circuit is allocated to each group. For example, a total of eight internal banks may be provided and the single internal voltage generation circuit may be allocated to each group including two banks. In this case, a total of four internal voltage generation circuits are provided. This is to minimize a waste of power consumption by enabling only the internal voltage generation circuit allocated to the selected bank. Therefore, the semiconductor memory device includes a decoding circuit that enables the plurality of internal voltage generation circuits in response to the selected bank.

FIG. 1 illustrates a decoding circuit of a semiconductor memory device in accordance with the related art. For convenience of explanation, FIG. 1 describes an example in which eight banks are divided into four groups and a single internal voltage generation circuit is allocated to each group.

Referring to FIG. 1, a decoding circuit 10 includes an inversion unit 12 and a decoder 14. The inversion unit inverts first and second bank address signals CBKAP1 and CBKAP2, respectively, and outputs the inverted first and second bank address signals CBKAP1B and CBKAP2B. The decoder 14 decodes the first and second bank address signals CBKAP1 and CBKAP2 and the inverted first and second bank address signals CBKAP1B and CBKAP2B and independently activates first to fourth decoding signals BKEN01, BKEN23, BKEN45, and BKEN67, respectively. Meanwhile, the decoder 14 may activate all of the first to fourth decoding signals BKEN01, BKEN23, BKEN45, and BKEN67 when a column burst signal YBSTBKOFF is activated.

Hereinafter, an operation of the semiconductor memory device that has the aforementioned configuration will be described.

However, the first and second bank address signals CBKAP1 and CBKAP2 are input through an address buffer (not shown) at the time of inputting a column command and are synchronized with clocks based on additive latency (AL) information and/or CAS write latency (CWL) information that are set in a mode register set (MRS). For example, the first and second bank address signals CBKAP1 and CBKAP2 are generated in a pulse form after a period of information related to write operation based on a clock edge to which the write command is input, where the period corresponds to additive latency (AL)+CAS write latency (CWL)+burst length (BL)/2*1tCK. Alternatively, the first and second bank address signals CBKAP1 and CBKAP2 are generated in a pulse form after a period of information related to read operation based on a clock edge to which a read command is input, where the period corresponds to additive latency (AL)*1tCK. For reference, 'tCK' means one period of the clock.

Meanwhile, the decoding circuit 10 generates the first to fourth decoding signals BKEN01, BKEN23, BKEN45, and BKEN67 that correspond to the first and second bank address signals CBKAP1 and CBKAP2 generated as described above. In this case, the decoding circuit 10 generates the first to fourth decoding signals BKEN01, BKEN23, BKEN45, and BKEN67 by using the decoding scheme to determine whether the first to fourth decoding signals BKEN01, BKEN23, BKEN45, and BKEN67 are activated based on a logical level state of the first and second bank address signals CBKAP1 and CBKAP2 as shown in the following 'Table 1'.

TABLE 1

| CBKAP<2> | CBKAP<1> | Output Signal |
|---|---|---|
| 0 | 0 | BKEN01 |
| 0 | 1 | BKEN23 |
| 1 | 0 | BKEN45 |
| 1 | 1 | BKEN67 |

Therefore, only any one of the four internal voltage generation circuits are enabled in response to the first to fourth decoding signals BKEN01, BKEN23, BKEN45, and BKEN67 to generate the internal voltage.

The semiconductor memory device can minimize current consumption.

However, although the semiconductor memory device in accordance with the related art can minimize the current consumption, it is difficult to verify the operation of the semiconductor memory device due to an unstable circuit of a power supply. In particular, a test mode of a wafer level has an operation period longer than other modes, for example, a normal mode or a test mode of a package level. For example, at the time of the test mode of the package level, one period tCK of the clock is about '1ns', but at the time of the test mode of the wafer level, one period tCK of the clock is about '20 ns'. For this reason, a need exists for stabilization of the power supply to improve the performance of the semiconductor memory device.

SUMMARY

An exemplary embodiment of the present invention is directed to a semiconductor memory device for stable supply of internal voltage at the time of a test mode.

Another exemplary embodiment of the present invention is directed to a semiconductor memory device that supplies stable internal voltage at a wafer level and minimally supplying internal voltage necessary for operation at a package level.

In accordance with an exemplary embodiment of the present invention, a semiconductor memory device includes a plurality of internal voltage generation units configured to be enabled in response to each of a plurality of decoding signals and to generate an internal voltage, a controller configured to generate a plurality of control signals in response to a power up signal and a test mode signal, and a decoder configured to generate the plurality of decoding signals corresponding to at least one decoding source signal and to simultaneously activate some or all of the plurality of decoding signals in response to the control signals.

In accordance with another exemplary embodiment of the present invention, a semiconductor memory device includes a plurality of banks configured to perform a predetermined operation using an internal voltage; a plurality of internal voltage generation circuits each provided corresponding to unit banks each including at least one of the plurality of banks, configured to be enabled in response to a plurality of decoding signals, and generate the internal voltage; a unit bank controller configured to generate unit bank control signals in response to a power up signal and a test mode signal; and a decoder configured to generate the plurality of decoding signals corresponding to at least one bank address and to simultaneously activate some or all of the plurality of decoding signals based on the unit bank control signals.

In accordance with yet another exemplary embodiment of the present invention, a method of driving a semiconductor memory device including a plurality of unit banks each including at least one bank and a plurality of internal voltage generation units provided corresponding to the plurality of banks in one to one scheme, the method includes a first step of simultaneously activating at least two of a plurality of decoding signals generated as a combination of at least one bank address signal and an unit bank control signal corresponding to a first state of a fuse when the semiconductor memory device enters a test mode of a wafer level; a second step of simultaneously enabling at least two of the plurality of internal voltage generation units; a third step of performing, in a selected bank, a predetermined test operation using internal voltage simultaneously generated from the at least two internal voltage generation units; and a fourth step of repeatedly performing the first to third steps so that all of the banks included in the plurality of unit banks perform the test operation.

DESCRIPTION OF SPECIFIC EMBODIMENTS

Hereinafter, exemplary embodiments of the present invention will be described with reference to the accompanying drawings so that a person with an ordinary skilled in the art to which the present invention pertains can easily carry out technical ideas of the present invention.

An embodiment of the present invention describes, for example, 8 banks in a group of two banks among 8 banks, which is referred to as a unit bank, and a single core voltage generation circuit, which is provided for each a unit bank. In addition, the embodiment of the present invention will describe an example of core voltage used in a core region that includes a memory cell array.

Figure 1:
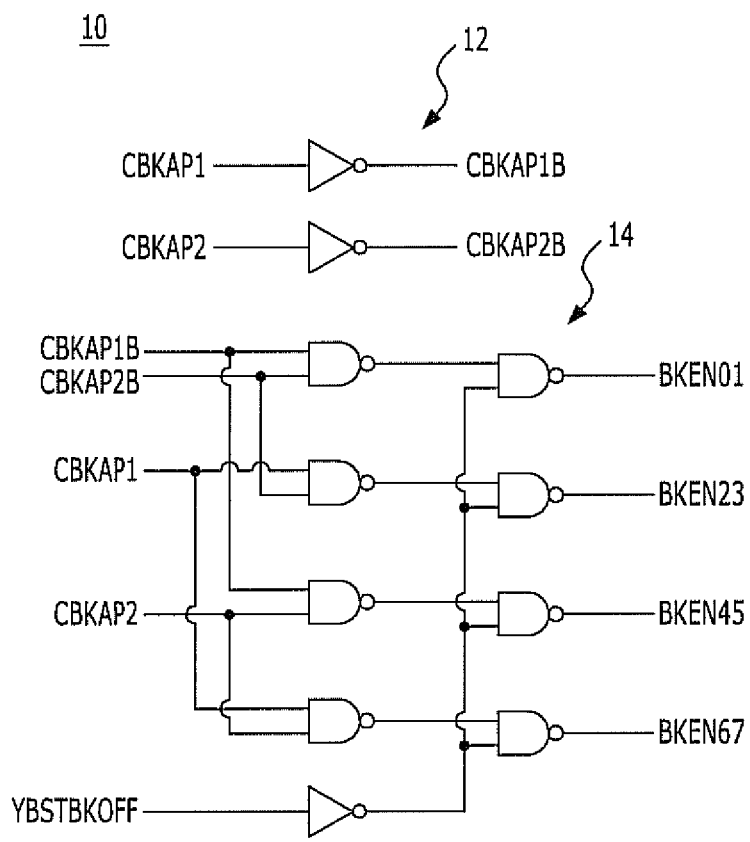
FIG. 1 is a diagram illustrating a decoding circuit of a semiconductor memory device in accordance with the related art.
Figure 2:
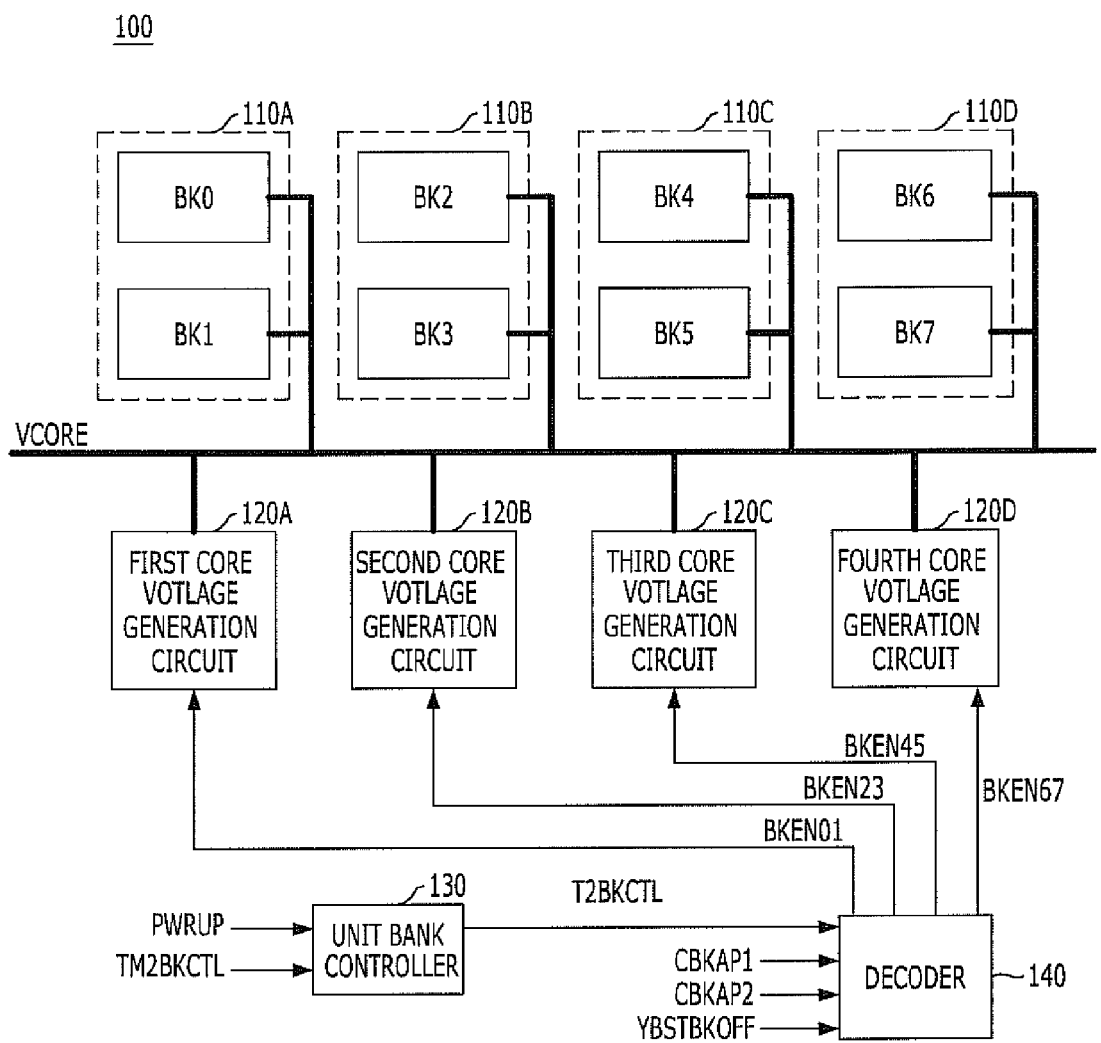
FIG. 2 is a block diagram of a semiconductor memory device in accordance with an embodiment of the present invention.

FIG. 2 shows a semiconductor memory device in accordance with the embodiment of the present invention.

Referring to FIG. 2, an exemplary embodiment of the semiconductor memory device includes first to fourth unit banks 110A, 110B, 110C, and 110D that perform a scheduled operation by using core voltage VCORE. The exemplary embodiment device also includes first to fourth core voltage generation circuits 120A, 120B, 120C, and 120D that are provided to correspond to the first to fourth unit banks 110A, 110B, 110C, and 110D, respectively, and become enabled in response to each of the first to fourth decoding signals BKEN01, BKEN23, BKEN45, and BKEN67. The exemplary embodiment further includes a unit bank controller 130 that generates a unit bank control signal T2BKCTL in response to a power up signal PWRUP and a test mode signal TM2BKCTL, and a decoder 140 that generates the first to fourth decoding signals BKEN01, BKEN 23, BKEN 45, and BKEN67 in response to first and second bank address signals CBKAP1 and CBKAP2. The decoder 140 independently activates the first to fourth decoding signals BKEN01, BKEN 23, BKEN 45, and BKEN67, respectively, based on the unit bank control signal T2BKCTL or simultaneously activates two decoding signals, for example, BKEN01 and BKEN23 formed in pair.

In this configuration, banks BK0, BK1, BK2, BK3, BK4, BK5, BK6, and BK7, which belong to the first to fourth unit banks 110A, 110B, 110C, and 110D, and the first to fourth core voltage generation circuits 120A, 120B, 120C, and 120D are known in advance and the detailed description is provided below.

Figure 3:
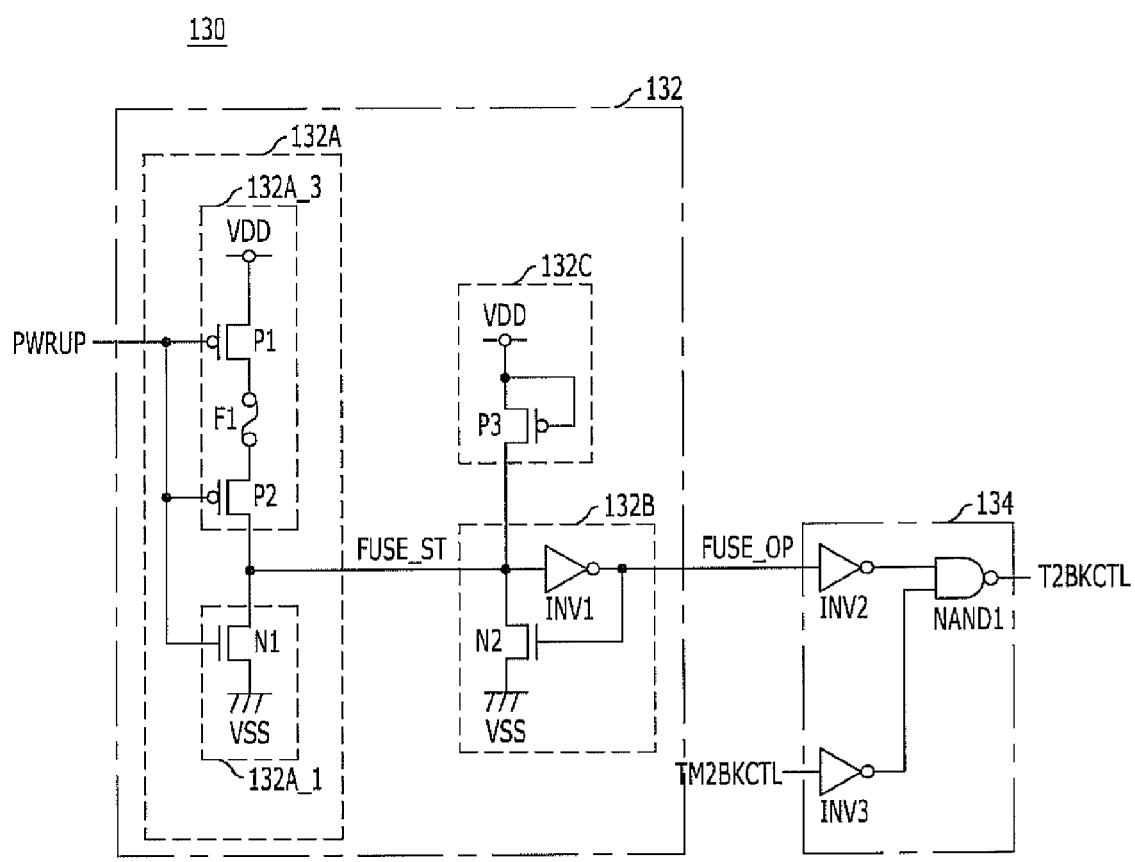
FIG. 3 is an internal configuration diagram of a unit bank control unit illustrated in FIG. 2.

Meanwhile, FIG. 3 shows an internal configuration diagram of the unit bank control unit 130 shown in FIG. 2.

Referring to FIG. 3, the unit bank control unit 130 includes a fuse option unit 132 that outputs a fuse option signal FUSE_OP that corresponds to a fuse state in response to a power up signal PWRUP, and an output unit 134 that outputs a unit bank control signal T2BKCTL in response to the fuse option signal FUSE_UP and the test mode signal TM2BKCTL.

In this embodiment, the fuse option unit 132 includes a fuse circuit unit 132A that outputs a fuse state signal FUSE_ST that corresponds to the fuse state in response to the power up signal PWRUP, a latch unit 132B that latches the fuse state signal FUSE_ST, and a voltage level stabilization unit 132C that is connected with an input terminal of the latch unit 132B in parallel.

The fuse circuit unit 132A includes an initialization unit 132A_1 that initializes an output terminal for outputting the fuse state signal FUSE_ST in response to the power up signal PWRUP to a ground voltage VSS level and a fuse unit 132A_3 that includes a fuse F1 and switches an output FUSE_ST terminal to a power supply voltage VDD level based on a state of the fuse F1 in response to the power up signal PWRUP. The initialization unit 132A_1 may include a first NMOS transistor N1 using the power up signal PWRUP as a gate input and having a source and a drain connected between the ground voltage VSS terminal and the output terminal of the fuse state signal FUSE_ST. The fuse unit 132A_3 may include a first PMOS transistor P1 using the power up signal PWRUP as the gate input and having a source and a drain connected between the power voltage VDD terminal and one terminal of the fuse F1, a second PMOS transistor P2 using the power up signal PWRUP as the gate input and having a source and a drain connected between the other terminal of the Fuse F1 and the output end of the fuse state signal FUSE_ST, and the fuse F1 connected between the first and second PMOS transistors P1 and P2. Meanwhile, the latch unit 132B may include a first inverter INV1, which inverts and outputs the fuse state signal FUSE_ST, and a second NMOS transistor N2 using the fuse option signal FUSE_OP output from the first inverter INV1 and having a source and a drain connected between the ground voltage VSS terminal and the output terminal of the fuse state signal FUSE_ST. Further, the voltage level stabilization unit 132C may include a third PMOS transistor P3 using the power supply voltage VDD as the gate input and having a source and a drain connected between the power supply VDD terminal and the output terminal of the fuse state signal FUSE_ST.

Figure 4:
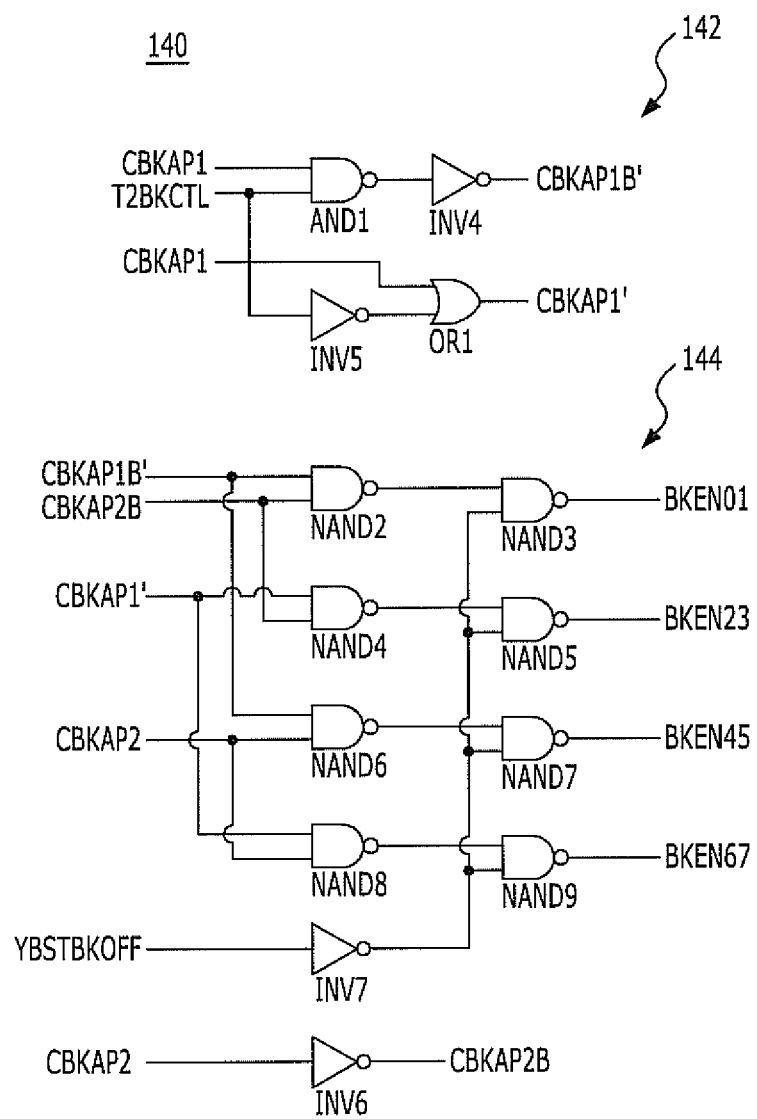
FIG. 4 is an internal configuration diagram of a decoder illustrated in FIG. 2.

FIG. 4 shows an internal diagram of a decoder illustrated in FIG. 2.

Referring to FIG. 4, the decoder 140 includes a first logic operator 142 that logically operates the unit bank control signal T2BKCTL and the first bank address signal CBKAP1 to generate first and second logic signals CBKAP1B' and CBKAP1'. The decoder 140 also includes a second logic operator 144 that logically operates the second bank address signal CBKAP2 and a column burst signal YBSTBKOFF to generate the first and fourth bank address signals CBKAP1B and CBKAP2B and activates some or all of the first and fourth bank address signals CBKAP1B and CBKAP2B. The first logic operator 142 includes an AND gate AND1 that performs AND operation on the first bank address signal CBKAP1 and the unit bank control signal T2BKCTL, a fourth inverter INV4 that inverts the output of the AND gate to output the first logic signal CBKAP1B', a fifth inverter INV5 that inverts and outputs the unit bank control signal T2BKCTL, and an OR gate OR1 that performs OR operation on the output of the fifth inverter INV5 and the first bank address signal CBKAP1 to output the second logic signal CBKAP1'.

The second logic operator 144 includes a sixth inverter INV6 that inverts and outputs the second bank address signal CBKAP2, a second NAND gate NAND2 that performs NAND operation on the output of the sixth inverter INV6 and the first logic signal CBKAP1B', a third NAND gate NAND3 that performs NAND operation on the output of the second NAND gate NAND2 and the column burst signal inverted through a seventh inverter INV7, a fourth NAND gate NAND4 that performs NAND operation on the output of the sixth inverter INV6 and the second logic signal CBKAP1', a fifth NAND gate NAND5 that performs NAND operation on the output of the fourth NAND gate NAND 4 and the output of the seventh inverter INV7, a sixth NAND gate NAND6 that performs NAND operation on the first logic signal CBKAP1B' and the second bank address signal CBKAP2, a seventh NAND gate NAND7 that performs NAND operation on the output of the sixth NAND gate NAND6 and the column burst signal inverted through the seventh inverter INV7 to output the third decoding signal BKEN45, an eighth NAND gate NAND8 that performs NAND operation on the second logic signal CBKAP1' and the second bank address signal CBKAP2, and a ninth NAND gate NAND9 that performs NAND operation on the output of the eighth NAND gate NAND8 and the column burst signal inverted through the seventh inverter INV7 to output the fourth decoding signal BKEN67.

Hereinafter, a method for driving a semiconductor memory device in accordance with the exemplary embodiment of the present invention, which has the aforementioned configuration, will be described with reference to FIGS. 5A and 5B.

Figure 5A:
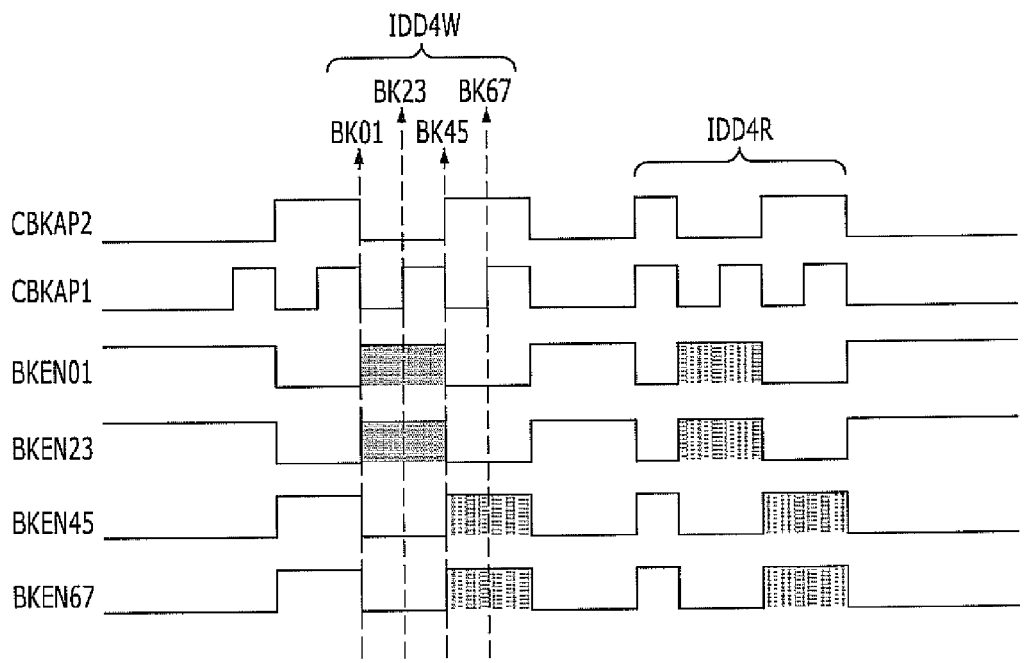
FIG. 5 is a timing diagram for describing a method of driving a semiconductor memory device in accordance with the embodiment of the present invention.
Figure 5B:
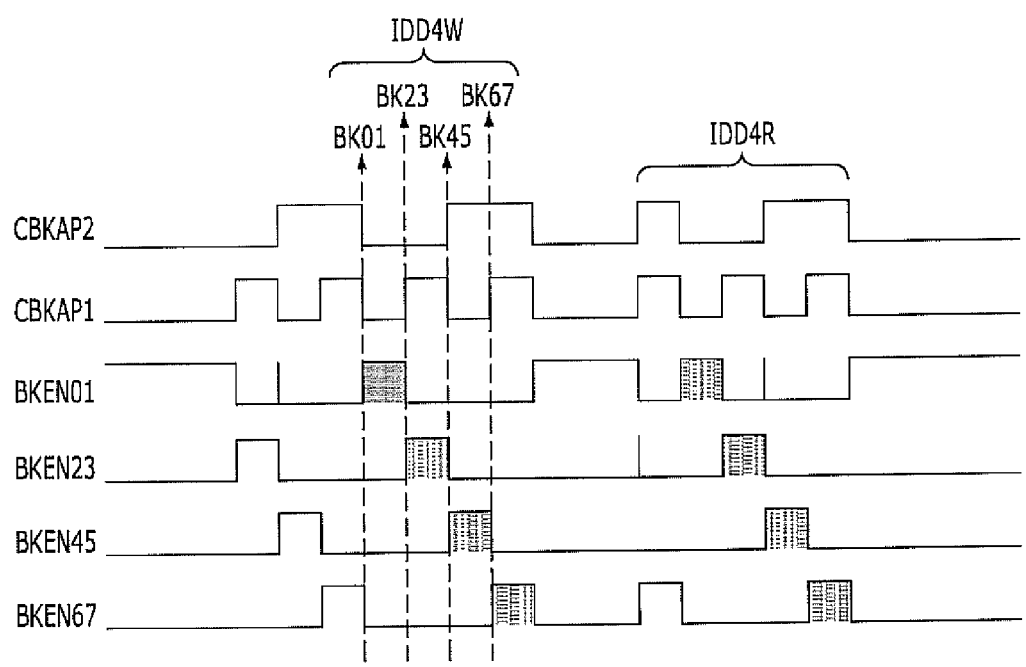

FIG. 5A shows a timing diagram for describing an operation when the semiconductor memory device is at a wafer level and FIG. 5B is a timing diagram for describing an operation when the semiconductor memory device is at a package level.

The first and second bank address signals CBKAP1 and CBKAP2 are input through an address buffer (not shown) at the time of inputting the column command and are synchronized with the clocks based on additive latency (AL) information and/or CAS write latency (CWL) information that are set in the mode register set (MRS). For example, the first and second bank address signals CBKAP1 and CBKAP2 are generated in a pulse form after a period of information related to write operation based on a clock edge to which the write command is input, where the period corresponds to additive latency (AL)+CAS write latency (CWL)+burst length (BL)/2*1tCK. Alternatively, the first and second bank address signals CBKAP1 and CBKAP2 are generated in a pulse form after a period of information related to read operation based on a clock edge to which a read command is input, where the period corresponds to additive latency (AL)*1tCK. For reference, 'tCK' means one period of the clock.

First, referring to FIG. 5A, it can be appreciated that the first and second decoding signals BKEN01 and BKEN23 are simultaneously activated based on any one selected from the first to fourth banks BK0, BK1, BK2, and BK3 included in the first and second unit banks 110A and 110B. The third and fourth decoding signals BKEN45 and BKEN67 are simultaneously activated based on any one selected from the fifth and eighth banks BK4, BK5, BK6, and BK7 included in the third and fourth unit banks 110C and 110D. Describing in more detail, because the fuse F1 is shorted before the test mode completes in the wafer level, the unit bank control unit 130 determines whether or not the unit bank control signal T2BKCTL is activated in response to the test mode signal TM2BKCTL regardless of the fuse option signal FUSE_OP. That is, the unit bank control unit 130 activates the unit bank control signal T2BKCTL only when the test mode signal TM2BKCTL is activated in the state in which the fuse F1 is short-circuited. Further, the decoder 140 activates the first and second decoding signals BKEN01 and BKEN23 or the third and fourth decoding signals BKEN45 and BKEN67 based on the logic level of the first and second bank address signals CBKAP1 and CBKAP2 in response to the activated unit bank control signal T2BKCTL.

Then, the first and second core voltage generation circuits 120A and 120B or the third and fourth core voltage generation circuits 120C and 120D among the first to fourth core voltage generation circuits 120A, 120B, 120C, and 120D generate the core voltage VCORE while being simultaneously enabled, in response to the first to fourth decoding signals BKEN01, BKEN23, BKEN45, and BKEN67.

Therefore, the predetermined test operation is performed by using the core voltage VCORE while the first to eight banks BK0 to BK7 included in the first to fourth unit banks 110A, 110B, 110C, and 110D are sequentially selected. In this case, if the first to fourth banks BK0 to BK3 included in the first and second unit banks 110A and 110B are selected, the test operation is performed by using the core voltage VCORE generated from the first and second core voltage generation circuits 120A and 120B. If the fifth to eight banks BK4 to BK7 included in the first and fourth unit banks 110C and 110D are selected, the test operation is performed by using the core voltage VCORE generated from the third and fourth core voltage generation circuits 120C and 120D.

As described above, when the wafer level test mode is completed, the unit bank control signal T2BKCTL is fixed to the predetermined voltage level through a process of cutting the fuse F1. In other words, when the F1 is opened, the unit bank control unit 130 randomly activates the unit bank control signal T2BKCTL, regardless of the test mode signal TM2BKCTL.

Referring to FIG. 5, when the unit bank control signal T2BKCTL is fixed to the predetermined voltage level and the test mode of the package level begins, each of the first to fourth decoding signals BKEN01, BKEN23, BKEN45, and BKEN67 is independently activated corresponding to the unit bank, where the bank is selected from the first to fourth unit (banks BK0 to BK7) so that only the single core voltage generation circuit is allocated for each unit bank. Describing in more detail, because the unit bank control signal T2BKCTL is fixed to the predetermined voltage, the decoding unit 140 decodes the first and second bank address signals CBKAP1 and CBKAP2, regardless of the unit bank control signal T2BKCTL, to sequentially activate the first to fourth decoding signals BKEN01, BKEN23, BKEN45, and BKEN67.

Then, the first to fourth core voltage generation circuits 120A, 120B, 120C, and 120D generate the core voltage VCORE while being sequentially enabled in response to the first to fourth decoding signals BKEN01, BKEN23, BKEN45, and BKEN67.

Therefore, the predetermined test operation is performed by using the core voltage VCORE, while the first to eight banks BK0 to BK7 included in the first to fourth unit banks 110A, 110B, 110C, and 110D are sequentially selected.

In this case, when the first or second banks BK0 and BK1 included in the first unit bank 110A are selected, the test operation is performed by using the core voltage VCORE, which is independently generated from the first core voltage generation circuit 120A. When the third or fourth banks BK2 and BK3 included in the second unit bank is selected, the test operation is performed by using the core voltage VCORE, which is independently generated from the second core voltage generation circuit 120B. When the fifth or sixth banks BK4 and BK5 included in the third unit bank 110C is selected, the test operation is performed by using the core voltage VCORE, which is independently generated from the third core voltage generation circuit 120C. When the seventh or eighth banks BK6 and BK7 included in the fourth unit bank 110D is selected, the test operation is performed by using the core voltage VCORE, which is independently generated from the fourth core voltage generation circuit 120D.

Similar to the aforementioned test mode, the enablement of the first to fourth core voltage generation circuits 120A, 120B, 120C, and 120D is controlled by the unit bank, where the selected banks belong, at the time of the normal mode of the package level. This is because the unit bank control signal T2BKCTL is fixed to the predetermined voltage level, regardless of the test mode signal TM2BKCTL, as the fuse F1 is opened.

In accordance with the embodiments of the present invention, the plurality of core voltage generation circuits are enabled at the time of the test mode of wafer level in which the test operation period is relatively long (approximately '20 ns') to generate the core voltage VCORE, thereby promoting the stabilization of the core voltage VCORE, and only the minimum core voltage generation circuit is enabled at the package level in which the test operation period is relatively short (approximately 'ins') to generate the core voltage VCORE, thereby minimizing the current consumption.

As set forth above, the exemplary embodiments of the present invention may increase the number of enabled internal voltage generation circuits at the time of the relatively long wafer level of the test mode and the number of internal voltage generation circuits enabled so as to supply the minimum internal voltage necessary for the operation at the time of the relatively short package level of the test mode to control the number of internal voltage generation circuits enabled based on conditions, thereby contributing to the stabilization of the internal voltage or prevention of unnecessary current consumptions.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a plurality of internal voltage generation units each configured to be enabled in response to each of a plurality of decoding signals and to generate an internal voltage;
   a controller configured to generate a control signal in response to a power up signal and a test mode signal; and
   a decoder configured to generate the plurality of decoding signals and to simultaneously activate some or all of the plurality of decoding signals in response to the control signal,
   wherein the number of enabled internal voltage generation units are controlled b selectively activated decoding signals.

2. The semiconductor memory device of claim 1, wherein the controller includes:
   a fuse option unit outputting a fuse option signal corresponding to a fuse state in response to the power up signal; and
   an output unit outputting the control signal in response to the fuse option signal and the test mode signal.

3. The semiconductor memory device of claim 2, wherein the fuse option unit includes:
   a fuse circuit unit outputting a fuse state signal corresponding to the fuse state in response to the power up signal; and
   a latch unit latching the fuse state signal.

4. The semiconductor memory device of claim 3, wherein the fuse circuit unit includes:
   an initialization unit initializing an output terminal for outputting the fuse state signal to a predetermined first voltage level in response to the power up signal; and
   a fuse unit including a fuse and switching the output terminal to a predetermined second voltage level based on a state of the fuse in response to the power up signal.

5. The semiconductor memory device of claim 3, wherein the fuse option unit further includes a voltage level stabilization unit connected in parallel with an input terminal of the latch unit.

6. The semiconductor memory device of claim 1, wherein the decoder includes:
   a first logical operator performing logical operation on the control signal and the decoding source signal to generate a plurality of logical signals; and
   a second logical operator performing logical operation on the plurality of logical signals and the decoding source signal to generate a plurality of decoding signals.

7. The semiconductor memory device of claim 6, wherein the second logical operator activates all of the plurality of decoding signals in response to a column burst signal.

8. A semiconductor memory device comprising:
   a plurality of banks configured to perform a predetermined operation using an internal voltage;
   a plurality of internal voltage generation circuits each provided corresponding to unit banks each including at least one of the plurality of banks, configured to be enabled in response to a plurality of decoding signals, and generate the internal voltage;
   a unit bank controller configured to generate unit bank control signals in response to a power up signal and a test mode signal; and
   a decoder configured to generate the plurality of decoding signals corresponding to at least one bank address and to simultaneously activate some or all of the plurality of decoding signals based on the unit bank control signals.

9. The semiconductor memory device of claim 8, wherein the unit bank controller includes:
   a fuse option unit outputting a fuse option signal corresponding to a fuse state in response to the power up signal; and
   an output unit outputting the unit bank control signal in response to the fuse option signal and the test mode signal.

10. The semiconductor memory device of claim 9, wherein the fuse option unit includes:
   a fuse circuit unit outputting a fuse state signal corresponding to the fuse state in response to the power up signal; and
   a latch unit latching the fuse state signal.

11. The semiconductor memory device of claim 10, wherein the fuse circuit unit includes:
   an initialization unit initializing an output terminal for outputting the fuse state signal to a predetermined first voltage level in response to the power up signal; and
   a fuse unit including a fuse and switching the output terminal to a predetermined second voltage level based on a state of the fuse in response to the power up signal.

12. The semiconductor memory device of claim 10, wherein the fuse option unit further includes a voltage level stabilization unit connected in parallel with an input terminal of the latch unit.

13. The semiconductor memory device of claim 8, wherein the decoder includes:
   a first logical operator performing logical operation on the unit bank control signal and the bank address to generate a plurality of logical signals; and
   a second logical operator performing logical operation on the plurality of logical signals and the bank address to generate a plurality of decoding signals.

14. The semiconductor memory device of claim 13, wherein the second logical operator activates all of the plurality of decoding signals in response to a column burst signal.

\* \* \* \* \*